(12) United States Patent
Gaidarzhy et al.

(10) Patent No.: US 8,111,108 B2
(45) Date of Patent: Feb. 7, 2012

(54) MICROMECHANICAL RESONATING DEVICES AND RELATED METHODS

(75) Inventors: Alexei Gaidarzhy, Boston, MA (US); Pritiraj Mohanty, Los Angeles, CA (US)

(73) Assignee: Sand9, Inc., Cambridge, MA (US)

( * ) Notice: Subject to any disclaimer, the term of this patent is extended or adjusted under 35 U.S.C. 154(b) by 861 days.

(21) Appl. No.: 12/181,531

(22) Filed: Jul. 29, 2008

(65) Prior Publication Data

US 2010/0026136 A1  Feb. 4, 2010

(51) Int. Cl.
*H03B 5/30* (2006.01)

(52) U.S. Cl. .................................. 331/154; 331/177 R

(58) Field of Classification Search .............. 331/116 R, 331/154, 177 R
See application file for complete search history.

(56) References Cited

U.S. PATENT DOCUMENTS

| | | | |
|---|---|---|---|
| 5,327,104 A | 7/1994 | Kikushima |
| 5,455,547 A | 10/1995 | Lin et al. |
| 5,473,289 A | 12/1995 | Ishizaki et al. |
| 5,491,360 A | 2/1996 | Lin et al. |
| 5,537,083 A | 7/1996 | Lin et al. |
| 5,589,082 A | 12/1996 | Lin et al. |
| 5,640,133 A | 6/1997 | MacDonald et al. |
| 5,644,271 A | 7/1997 | Molloy et al. |
| 5,839,062 A | 11/1998 | Nguyen et al. |
| 5,883,550 A | 3/1999 | Watanabe et al. |
| 5,914,553 A | 6/1999 | Adams et al. |
| 5,959,516 A | 9/1999 | Chang et al. |
| 6,124,765 A | 9/2000 | Chan et al. |
| 6,249,073 B1 | 6/2001 | Nguyen et al. |
| 6,424,074 B2 | 7/2002 | Nguyen |
| 6,557,419 B1 | 5/2003 | Herb et al. |
| 6,563,238 B1 * | 5/2003 | Lee et al. ................. 310/15 |
| 6,577,040 B2 | 6/2003 | Nguyen |
| 6,593,831 B2 | 7/2003 | Nguyen |
| 6,600,252 B2 | 7/2003 | Nguyen |
| 6,667,558 B2 | 12/2003 | Wong et al. |
| 6,680,660 B2 | 1/2004 | Nguyen |
| 6,710,680 B2 | 3/2004 | Niu et al. |
| 6,713,938 B2 | 3/2004 | Nguyen |
| 6,737,939 B2 | 5/2004 | Hoppe et al. |
| 6,739,190 B2 | 5/2004 | Hsu et al. |
| 6,828,713 B2 | 12/2004 | Bradley et al. |
| 6,831,531 B1 | 12/2004 | Giousouf et al. |
| 6,856,217 B1 | 2/2005 | Clark et al. |
| 6,859,113 B2 | 2/2005 | Giousouf et al. |
| 6,861,914 B2 | 3/2005 | Photiadis et al. |

(Continued)

FOREIGN PATENT DOCUMENTS

WO  WO 98/01948 A1  1/1998

(Continued)

OTHER PUBLICATIONS

Gaidarzhy, A. et al., "Spectral response of a gigahertz-range nanomechanical oscillator," *App. Phys. Lett.* 86, 254103-1, 2005 American Inst. of Physics, 3 pages.

(Continued)

*Primary Examiner* — David Mis

(74) *Attorney, Agent, or Firm* — Wolf, Greenfield & Sacks, P.C.

(57) ABSTRACT

Micromechanical resonating devices, as well as related methods, are described herein. The resonating devices can include a micromechanical resonating structure, an actuation structure that actuates the resonating structure, and a detection structure that detects motion of the resonating structure.

32 Claims, 6 Drawing Sheets

U.S. PATENT DOCUMENTS

| | | |
|---|---|---|
| 6,909,221 B2 | 6/2005 | Ayazi et al. |
| 6,917,138 B2 | 7/2005 | Nguyen |
| 6,930,569 B2 | 8/2005 | Hsu |
| 6,943,484 B2 | 9/2005 | Clark et al. |
| 6,954,020 B2 | 10/2005 | Ma et al. |
| 6,958,566 B2 | 10/2005 | Nguyen et al. |
| 6,985,051 B2 | 1/2006 | Nguyen et al. |
| 6,987,432 B2 | 1/2006 | Lutz et al. |
| 6,995,622 B2 | 2/2006 | Partridge et al. |
| 7,005,946 B2 | 2/2006 | Duwel et al. |
| 7,068,125 B2 | 6/2006 | Lutz et al. |
| 7,098,753 B1 | 8/2006 | Dumitrescu et al. |
| 7,102,467 B2 | 9/2006 | Lutz et al. |
| 7,202,761 B2 | 4/2007 | Lutz et al. |
| 7,211,926 B2 | 5/2007 | Quevy et al. |
| 7,215,061 B2 | 5/2007 | Kihara et al. |
| 7,248,128 B2 | 7/2007 | Mattila et al. |
| 7,352,608 B2 | 4/2008 | Mohanty et al. |
| 7,358,822 B2 | 4/2008 | Aubin et al. |
| 7,492,241 B2 | 2/2009 | Piazza et al. |
| 7,504,909 B2 | 3/2009 | Tada |
| 7,545,239 B2 | 6/2009 | Hagelin et al. |
| 7,724,103 B2 | 5/2010 | Feng et al. |
| 7,791,432 B2 | 9/2010 | Piazza et al. |
| 2003/0186672 A1 | 10/2003 | Buchaillot et al. |
| 2005/0073078 A1 | 4/2005 | Lutz et al. |
| 2005/0253571 A1 | 11/2005 | Frank et al. |
| 2007/0170440 A1 | 7/2007 | Partridge et al. |
| 2007/0247245 A1 | 10/2007 | Hagelin |
| 2007/0257728 A1 | 11/2007 | Boser et al. |
| 2007/0257740 A1 | 11/2007 | Boser et al. |
| 2008/0143217 A1 | 6/2008 | Ho et al. |
| 2008/0204153 A1 | 8/2008 | Yoshida et al. |
| 2008/0272852 A1 | 11/2008 | Six |
| 2009/0108381 A1 | 4/2009 | Buchwalter et al. |
| 2009/0108959 A1 | 4/2009 | Piazza et al. |
| 2009/0144963 A1 | 6/2009 | Piazza et al. |
| 2009/0243747 A1 | 10/2009 | Gaidarzhy et al. |
| 2009/0267699 A1 | 10/2009 | Mohanty et al. |
| 2009/0294638 A1 | 12/2009 | Mohanty et al. |
| 2010/0007443 A1 | 1/2010 | Mohanty et al. |
| 2010/0134207 A1 | 6/2010 | Mohanty et al. |
| 2010/0155883 A1 | 6/2010 | Wenzler et al. |

FOREIGN PATENT DOCUMENTS

| | | | |
|---|---|---|---|
| WO | WO 98/37635 | A1 | 8/1998 |
| WO | WO 02/17481 | A2 | 2/2002 |
| WO | WO 03/043189 | A | 5/2003 |
| WO | WO 2006/000611 | A1 | 1/2006 |
| WO | WO 2006/083482 | A2 | 8/2006 |
| WO | WO 2007/072408 | A2 | 6/2007 |
| WO | WO 2007/072409 | A2 | 6/2007 |
| WO | WO 2010/011288 | A1 | 1/2010 |

OTHER PUBLICATIONS

Humad et al., "High frequency micromechanical piezo-on-silicon block resonators," Int'l Electron Devices Meeting 2003 IEDM. Technical Digest, Washington, D.C. Dec. 8-10, 2003, New York, NY: IEEE US Dec. 8, 2003, pp. 957-960.

International Search Report and Written Opinion from International Application No. PCT/US2009/004353 mailed Nov. 23, 2009.

International Search Report and International Preliminary Report on Patentability for PCT/US2006/021298 mailed Nov. 6, 2006 and Dec. 6, 2007 respectively.

International Search Report and Written Opinion from International Application No. PCT/US2007/079078, mailed Jul. 3, 2008.

International Search Report and Written Opinion from International Application No. PCT/US2008/003793, mailed Jun. 16, 2008.

Piazza et al., "Low motional resistance ring-shaped contour-mode aluminum nitride piezoelectric micromechanical resonators for UHF applications," Micro Electro Mechanical Systems, 2005. MEMS 2005. 18th IEEE International Conference on Miami Beach, Florida, Jan. 30-Feb. 3, 2005, Piscataway, New Jersey, US, IEEE Jan. 30, 2005, pp. 20-23.

* cited by examiner

MICROMECHANICAL RESONATING DEVICES AND RELATED METHODS

FIELD OF INVENTION

The invention relates generally to micromechanical resonating devices, and more particularly, to tunable micromechanical resonating devices as well as related methods.

BACKGROUND OF INVENTION

Tunable devices can be used for various applications such as performing signal processing operations and functions. It is advantageous to have tunable devices because one can tune and/or calibrate a device to account for any manufacturing glitches while implementing a design on a chip or to provide a user the flexibility to adjust, if desired, the operating conditions of a device. For example, a filter can be tuned to adjust the pass band spectral range. In another example, an amplifier can be tuned for achieving a particular gain.

One method of tuning devices is by tuning the capacitance. For example, basic designs of filters include LR (inductor-resistor) and RC (resistor-capacitor) filters, and by tuning the capacitance, one can tune the filter. A tunable capacitance is also useful in several other devices such as charge capacitors, tunable antennas, and mobile phones.

Several methods currently exist for tuning capacitors. However many of the methods require excessive circuit size, complex circuitry, and/or result in increased loss, and low Q-factors. Furthermore, tradeoffs between capacitance tuning, impedance matching, and a high Q factor make designs for tunable capacitive designs complicated.

SUMMARY OF INVENTION

Micromechanical resonating devices, as well as related methods, are described herein.

According to one aspect, a micromechanical device is provided. The micromechanical device comprises a mechanical resonating structure and an actuation structure constructed and arranged to actuate the resonating structure. The micromechanical device further comprises a detection structure constructed and arranged to detect motion of the resonating structure. An actuation gap is defined between a first portion of the resonating structure and a portion of the actuation structure, and a detection gap is defined between a second portion of the resonating structure and a portion of the detection structure. At least one of the actuation structure and the detection structure is constructed and arranged to move relative to the resonating structure to respectively tune the actuation gap and/or the detection gap.

According to another aspect, a micromechanical device is provided. The device comprises a mechanical resonating structure including a suspended resonating portion defined between a first end and a second end. The micromechanical device further comprises an actuation structure constructed and arranged to actuate the resonating structure. The actuation structure includes a suspended actuation portion defined between a third end and a fourth end. The micromechanical device further comprises a detection structure constructed and arranged to detect motion of the resonating structure. The detection structure includes a suspended detection portion defined between a fifth and a sixth end.

According to another aspect, a micromechanical device is provided. The device comprises a capacitive structure comprising a suspended first portion and a suspended second portion separated from the first portion by a distance. At least one of the first portion and the second portion is designed to actuate in response to an applied bias to change the distance. The micromechanical device further comprises a mechanical resonating structure located, at least in part, between the first portion and the second portion.

According to another aspect, a timing oscillator is provided. The timing oscillator comprises a mechanical resonating structure including a major element and a minor element coupled to the major element and a drive circuit designed to provide an input signal to the mechanical resonating structure. The timing oscillator further comprises a compensation circuit coupled to the mechanical resonating structure, an actuation structure constructed and arranged to actuate the mechanical resonating structure, and a detection structure constructed and arranged to detect motion of the mechanical resonating structure. An actuation gap is defined between a portion of the mechanical resonating structure and a portion of the actuation structure. A detection gap is defined between a portion of the mechanical resonating structure and a portion of the detection structure. At least one of the actuation structure and the detection structure is constructed and arranged to move relative to the mechanical resonating structure to respectively tune the actuation gap and/or the detection gap.

According to another aspect, a method of operating a micromechanical device is provided. The method comprises providing a micromechanical device. The micromechanical device includes a mechanical resonating structure, an actuation structure constructed and arranged to actuate the resonating structure, and a detection structure constructed and arranged to detect motion of the resonating structure. An actuation gap is defined between a portion of the resonating structure and a portion of the actuation structure. A detection gap is defined between a portion of the resonating structure and a portion of the detection structure. The method further comprises moving the actuation structure and/or the detection structure relative to the resonating structure to respectively tune the actuation gap and/or detection gap. The method further comprises actuating the resonating structure.

Other aspects, embodiments and features of the invention will become apparent from the following detailed description of the invention when considered in conjunction with the accompanying drawings. The accompanying figures are schematic and are not intended to be drawn to scale. In the figures, each identical, or substantially similar component that is illustrated in various figures is represented by a single numeral or notation. For purposes of clarity, not every component is labeled in every figure. Nor is every component of each embodiment of the invention shown where illustration is not necessary to allow those of ordinary skill in the art to understand the invention. All patent applications and patents incorporated herein by reference are incorporated by reference in their entirety. In case of conflict, the present specification, including definitions, will control.

DETAILED DESCRIPTION

Micromechanical resonating devices, as well as related methods, are described herein. The resonating devices can include a micromechanical resonating structure, an actuation structure that actuates the resonating structure, and a detection structure that detects motion of the resonating structure. The actuation structure can be separated from the resonating structure by one gap (e.g., actuation gap) and the detection structure can be separated from the resonating structure by another gap (e.g., detection gap). As described further below, by applying a bias (i.e., voltage, current) to one or more of the structures, the actuation and/or detection gap(s) may be changed. In these cases, as described further below, the applied bias enables tuning of the gap distance. For example, the gap(s) may be decreased compared to an original gap distance to increase the effective capacitance between the actuation structure and resonating structure and/or between the detection structure and resonating structure. Increasing the effective capacitance can minimize signal losses within the device, amongst other advantages, which can enhance performance.

Figure 1:
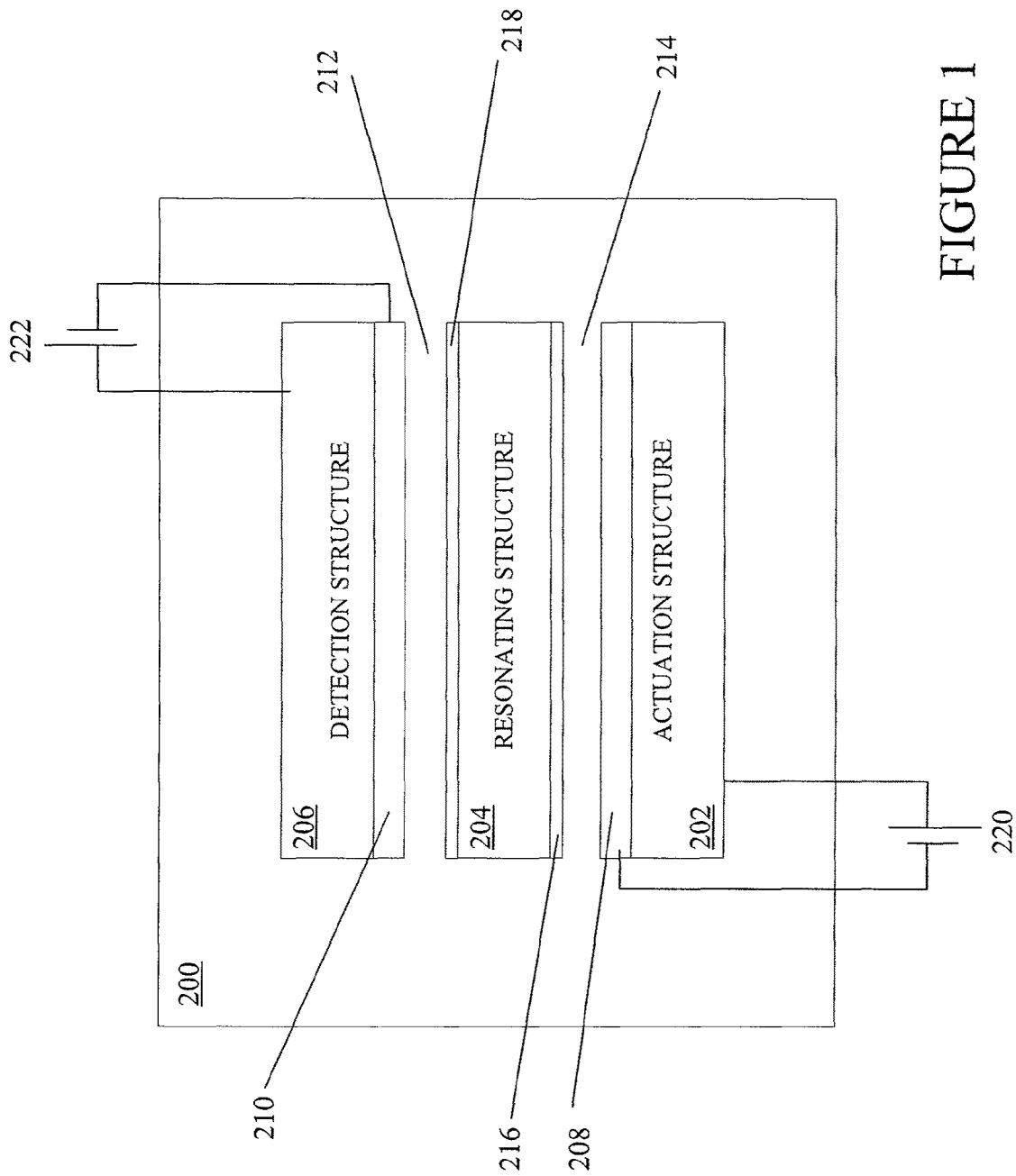
FIG. 1 shows a block diagram of a micromechanical resonating device according to an embodiment of the present invention.

FIG. 1 shows a block diagram of a micromechanical resonating device 200 according to an embodiment of the invention. The device can include an actuation structure 202, a resonating structure 204, and a detection structure 206. As described further below, the device can be designed to allow several characteristics (i.e., capacitive gap(s), resonant frequency) to be tuned. The tunability of the characteristics makes such devices very useful and attractive in numerous applications and circuits, such as filters, timing oscillators, and charge pumps. The devices may include one or more active and/or passive circuit components, either as discrete components, an integrated circuit, or any other suitable form, as the various aspects of the invention are not limited to any particular implementation.

The actuation structure 202 is the driving mechanism of the device. That is, the actuation structure is used to drive the resonating structure by actuating (i.e., moving) the resonating structure to vibrate at a desired frequency. In general, any suitable actuation structure and associated excitation technique may be used to drive the resonating structure 204. Examples of suitable actuation structures are described further below, including micromechanical actuation structures (e.g., that include one or more feature having a dimension of less than 100 microns). In some cases, the actuation structure uses a capacitive (i.e., electrostatic) excitation technique to actuate the resonating structure. However, it should be understood that other excitation techniques may be used in certain embodiments such as mechanical, electromagnetic, piezoelectric or thermal.

In the embodiments shown, the resonating structure 204 is a micromechanical resonator. Micromechanical resonators are physical structures that are designed to vibrate at high frequencies. Suitable micromechanical resonators have been described, for example, in International Publication No. WO 2006/083482, U.S. patent application Ser. No. 12/028,327, filed Feb. 8, 2008, and in U.S. patent application Ser. No. 12/142,254, filed Jun. 19, 2008 and published as U.S. Patent Publication No. 2009/0243747 A1, which are incorporated herein by reference in their entireties. In general, a variety of different resonator designs may be used for the resonating structure. For example, the structures may include beams (e.g., suspended beams), platforms and the like; the structures can be comb-shaped, circular, rectangular, square, or dome-shaped, as described further below.

The detection structure 206 detects motion of the resonating structure. In general any suitable structure and associated detection technique may be used. In some embodiments, the detection structure comprises a micromechanical structure. Examples are described further below. In some embodiments, the detection structure may have a structure similar to the actuation structure. In other embodiments, the detection structure and the actuation structure can be the same structure. That is, the device may include a single structure that functions as both the actuation structure and the detection structure. For example, in the device of FIG. 2, structure 202 may function as a detection structure as well as the actuation structure.

According to some embodiments, the detection structure uses a capacitive (i.e., electrostatic) technique to sense the motion of the resonating structure. However, it should be understood that other detection techniques may be used in certain embodiments such as mechanical, electromagnetic, piezoelectric or thermal.

The detection structure can have sensors capable of detecting operating conditions of the device and/or of measuring characteristics of an output signal. For example, the detection structure may measure the frequency of the signal generated by the resonating structure. The detection structure may also be able to sense the gap between the resonating structure and the detection structure and/or between the actuation structure and the resonating structure. The detection structure may also be able to measure the current across a portion in the actuation and/or detection structures.

Sensors can be integrated into the detection structure or can be connected to the detection structure using any suitable means. For example, a sensor and/or sensing circuitry can be attached to the detection circuit as an external component. The sensors, after obtaining a measurement, can provide feedback to the actuation structure or a drive circuit to modify, if needed, the performance of the resonating structure. For example, using the feedback mechanism, a measured frequency of the resonating structure can be tuned to another frequency, if needed, by adjusting the bias supplied to the actuation structure.

In the illustrative embodiments, the actuation structure can be separated from the resonating structure by an actuation gap 214, and the detection structure can be separated from the resonating structure by a detection gap 212. The actuation gap is generally defined between a portion 208 of the actuation structure and a portion 216 of the resonating structure; and, the detection gap is defined between a portion 210 of the detection structure and a portion 218 of the resonating structure. The actuation and/or detection gaps do not have to be constant along the length of the resonating structure. For example, the distance between different parts of the resonating structure and the actuation structure and/or detection structure may vary from one part of the resonating structure to another. The actuation and/or detection gaps may also be static or dynamic during use. For example, in some cases, a gap may be dynamic and vary over time and, in other cases, a gap may be static and may remain substantially constant over time.

According to some embodiments, portions 208, 210, 216 and 218 are sufficiently electrically conductive to form respective capacitors between portions 208 and 216, and between portions 210 and 218. In such embodiments, the actuator gap and detection gap may be referred to as capacitive gaps.

The portions may be formed of a suitably electrically conductive material such as a metal or doped semiconductor. The portions may be formed of a different material (e.g., in the form of a coating) than other parts of the actuation, resonating and detection structures. That is, portion 208 may be formed of a first material, while other parts of the actuation structure may be formed of a different material. However, in some embodiments, the portions are formed of the same material as other parts of the actuation, resonating and detection structures. Also, it should be understood that the portions may not extend across the entire surface area of the actuation structure, resonating structure, and/or detection structure. That is, the portions may be a localized region on the actuation structure, resonating structure and/or detection structure.

In some embodiments, actuation gap 214 and/or detection gap 212 are variable and can be tuned. By tuning, it is meant that the gap(s) can be varied by controlling an input parameter. For example, a bias (i.e., voltage, current) may be applied to one or more of the actuation, detection and resonating structures to tune the gap. When a bias (220, 222) is applied to the actuation and/or detection structure, a capacitance across the actuation gap between portions 208 and 216 can be modified. The capacitance can be determined as a function of the area of portions (208, 216) and the gap between the portions, and the permittivity of the medium between the portions. Varying the bias, for example, can cause one of the portions to move and the capacitance to change. For example, the gap between the portions may be decreased and the capacitance may be increased. For example, portion 208 (and associated parts of the actuation structure) may be moved closer to portion 216 (and associated parts of the resonating structure). In addition, the resonating frequency of the resonating structure can be tuned by varying this bias and changing the effective capacitance between the two portions.

In some embodiments, the actuation and/or detection gap can be tuned internally because input parameters that control the tuning of the gap(s) can be adjusted internally. For example, the feedback mechanism described above can automatically tune the gap(s) internally. In other embodiments, the actuation and/or detection gap can be tuned externally. For example, an applied bias can be adjusted externally by a user. The applied bias used to tune the gap(s) can, in come embodiments, be different then the bias used to control other aspects of the micromechanical resonating device. For example, the tuning bias may be different than the bias used to drive the resonating structure.

Other methods of tuning the gap(s) include stress storing and thermomechanical heating. For example, when a current flows across portion 208, the portion can get heated and expand. Expansion of the portion can lead to a reduction of the gap between the resonating structure and the actuation structure and/or detection structure. In general, any suitable method known to one of ordinary skill in the art may be used.

In some embodiments, the actuation gap and/or detection gap is reduced by between 1% and 99%; in some embodiments by between 1% and 33% its original value; and in other embodiments by between 1% and 50%. Typical gap distances, after reduction, are between 0.01 microns and 100 microns; or, between 1 microns and 100 microns; or, between 0.01 microns and 0.1 microns. Typical original gap distances, before reduction, are between 0.1 microns and 100 microns; or, between 0.3 microns and 10 microns.

Figures 2, 3:
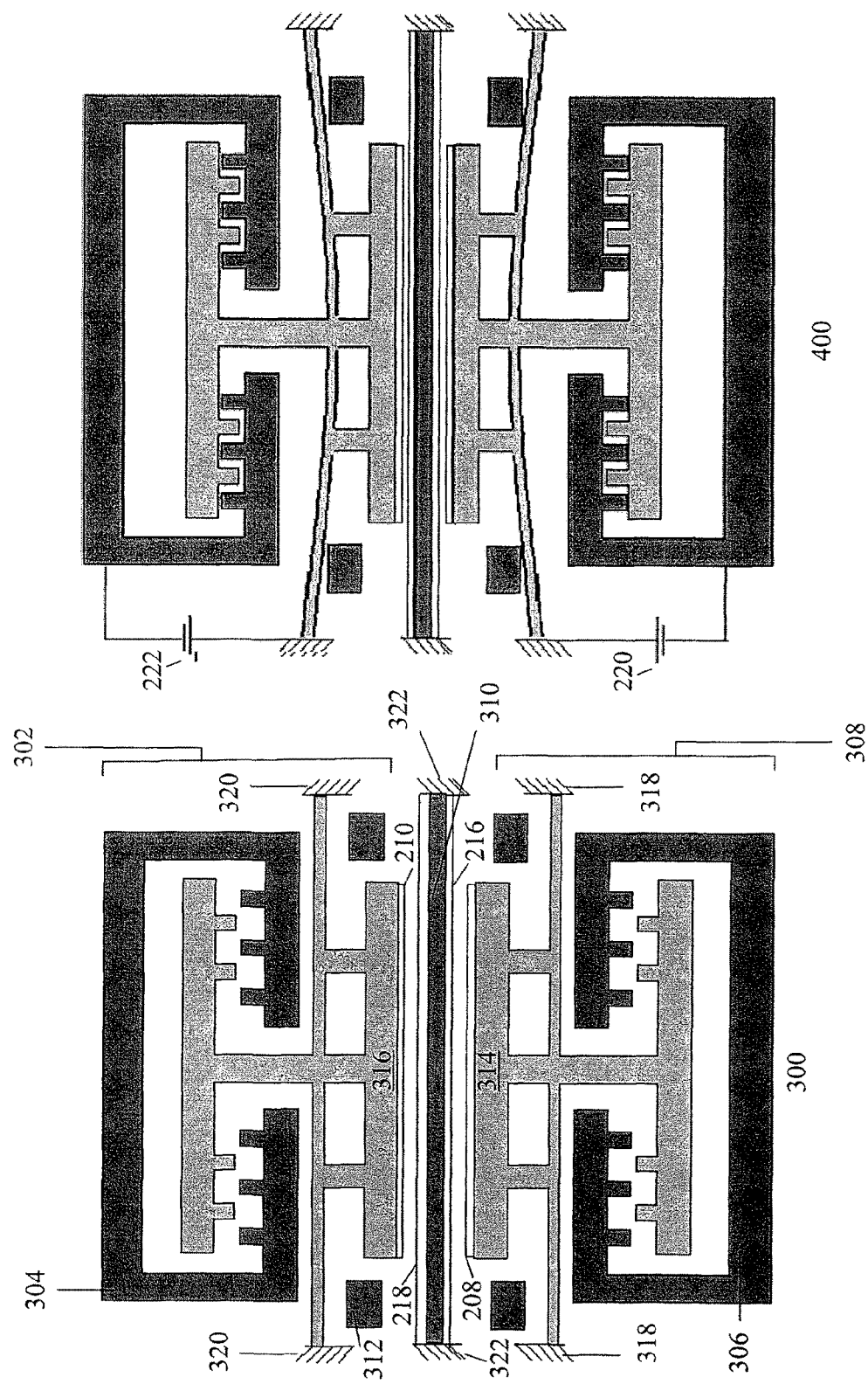
FIG. 2 shows a diagram of a tunable micromechanical resonating device with no applied biasing according to an embodiment of the present invention.
FIG. 3 shows a diagram of a tunable micromechanical resonating device with applied biasing according to an embodiment of the present invention.

FIG. 2 shows a resonating structure 218 situated between a actuation structure 308 and a detection structure 302 according to some embodiments. In the illustrative embodiment, the actuation structure includes a suspended element 314 and a fixed element 306; and, the detection structure includes a suspended element 316 and a fixed element 304. As described further below, the suspended elements are movable, for example, in response to electrostatic forces. As illustrated in FIG. 2, these elements may include a and/or comb-shaped structure. Such comb-shaped structures are well known in the art. The comb structures can be separated by a distance and may have interleaved finger electrodes capable of being activated when a voltage is applied.

Though the illustrative embodiments show both the actuation structure and the detection structure as including a fixed element and a suspended element, it should be understood that a variety of different configurations are possible. For example, in some embodiments, the actuation structure and/or detection structure may include two suspended elements. In other embodiments, only one of the actuation structure or the detection structure may include such elements. In some cases, the actuation and/or detection structures may have different designs that are not based on fixed and/or suspended elements. It should also be understood that the resonating structure may include a suspended element, as shown in the figures.

In FIG. 2, the suspended element, for example, is fixed at ends 318. Similarly, in this embodiment, the detection structure includes a suspended element 316 held fixed at ends 320. Also, as shown, the suspended resonating structure 310 is fixed at ends 322. The ends can define and/or limit the location and movement of the suspended actuation, detection, and/or resonating structures.

Furthermore, motion limiting elements 312 may be used to limit the motion of the actuation structure and/or the detection structure toward the resonating structure thereby limiting the respective gaps as described further below. For example, the motion limiting elements can be placed between the resonating structure and the actuation structure and/or between the resonating structure and the detection structure to limit the movement of the actuation structure and the movement of the detection structure. In general, any number of motion limiting elements may be used in any suitable configuration to limit the motion of the structures.

According to some embodiments, the motion limiting elements can ensure variable gaps 212 and 214 are not reduced too significantly (e.g., by more than 66% of the original (i.e., steady-state gap) to prevent inadvertent contact or pull-in between the resonating structure and the actuation and/or detection structures. Thus, the motion limiting elements can enhance the stability of the device.

In general, the motion limiting elements may have any suitable design. In some embodiments, the motion limiting elements are features that limit movement by physical contact with the appropriate structure (e.g., actuation structure, detection structure). For example, part of the suspended elements 314, 316 may physically contact the motion limiting elements to limit their motion.

FIG. 3 shows the device of FIG. 2 after tuning of the actuation and detection gaps. It should be understood that, in some embodiments, only one of the actuation and detection gaps is tuned. For example, in these embodiments, the actuation gap may be tuned; or, the detection gap may be tuned.

The gaps may be tuned by application of a bias (i.e., voltage, current). For example, a voltage may be applied to actuation structure and/or the resonating structure and/or the detection structure. When a bias (220, 222) is applied to the activation and detection structures, as shown in FIG. 3, the respective distances between the suspended elements 314, 316 and stationary elements 304, 306 of the actuation and detection structures may be reduced. In such cases, the suspended element can move towards the stationary element. If both elements are suspended and movable, then both structures may move towards each other.

The applied bias creates a difference in voltage between the actuation structure and the resonating structure and/or between the detection structure and the resonating structure. The applied bias can also cause a current to flow in portions 208 and 210. The voltage difference and current flow can cause portions 314 and 316 to move as shown in FIG. 3. The amount of movement depends on several factors including the amount of applied bias. In general, any suitable voltage or current may be applied to the actuation structure. The movement can be towards the resonating structure or away from the resonating structure, though in most embodiments, movement that decreases the actuation and detection gaps is preferred.

The current flow in portions 314 and 316 can create capacitive structures, as described above. The capacitive structures can be created between portion 216 of the resonating structure and portion 208 of the actuation structure and/or between portion 218 of the resonating structure and portion 210 of the detection structure. Actuation or movement of portion 314 (and 208) and/or portion 316 (and 210) due to the applied bias also affects the capacitance between portion 216 of the resonating structure and portion 208 of the actuation structure and/or the capacitance between portion 218 of the resonating structure and portion 210 of the detection structure. Other properties that can be influenced by the movement of portions 314 and 316 include the resonance frequency, the Q-factor, the effective impedance and associated network losses. Thus, by carefully monitoring and manipulating the actuation structure, one can control the capacitance, the resonance frequency, the effective impedance and associated network losses of the device. For example, if the effective impedance is too high, an applied voltage may be adjusted to lower the effective device impedance. In another example, the current supplied by the actuation structure may be adjusted to ensure the output signal produced by the resonator has a certain frequency.

When devices described herein are used, in some embodiments, the actuation and/or detection gap is tuned (e.g., reduced), as described above. In conjunction with the tuning, the resonating structure can be actuated by the actuation structure so that the resonating structure resonates at a desired frequency. The resonating structure is actuated by the electrostatic forces generated from the applied bias. In some embodiments, the resonating structure resonates primarily in a plane perpendicular to the actuation gap and/or the detection gap.

Figure 4:
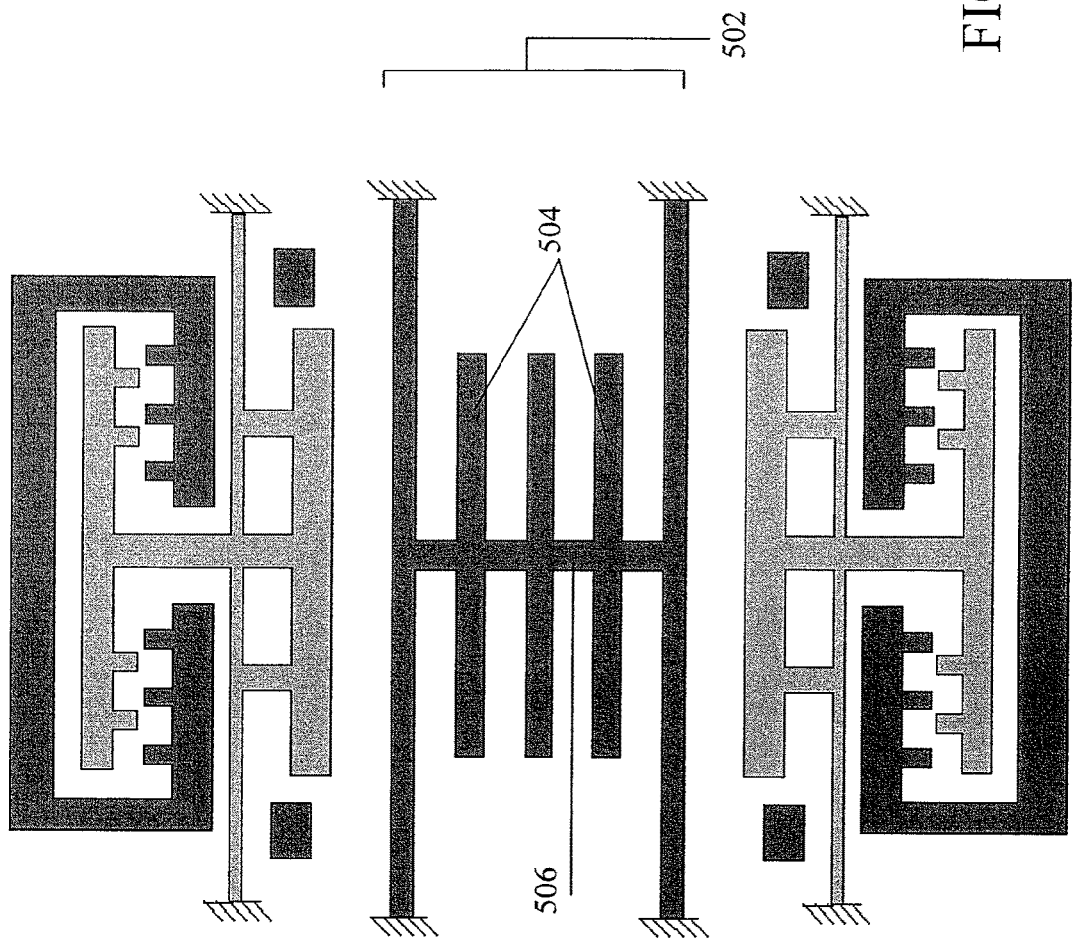
FIG. 4 shows a tunable micromechanical resonating device with a resonating structure having major and minor elements according to an embodiment of the present invention.

According to some embodiments, as shown in FIG. 4, a resonating structure 502 includes multiple minor elements 504 coupled to a major element 506. The minor elements are in the form of cantilever beams and the major element is in the form of a doubly-clamped beam which extends between two supports. Suitable excitation provided by the actuation structure vibrates the minor elements at a high frequency. Vibration of the minor elements influences the major element to vibrate at a high frequency but with a larger amplitude than that of the individual minor elements. Mechanical vibration of the major element may be converted to an electrical output signal which, for example, may be further processed. The frequency produced by the resonating structure can, for example, vary from a few KHz up to 10 GHz, depending on the design and application. Other suitable mechanical resonator designs may be used, including designs with different arrangements of major and minor elements.

Major and minor element dimensions are selected, in part, based on the desired performance including the desired frequency range of input and/or output signals associated with the device. Suitable dimensions have been described in International Publication No. WO 2006/083482 which is incorporated herein by reference above. It should also be understood that the major and/or minor elements may have any suitable shape and that the devices are not limited to beam-shaped elements. Other suitable shapes have been described in International Publication No. WO 2006/083482.

In some embodiments, the minor elements have dimensions in the nanoscale and are thus capable of vibrating at fast speeds producing resonant frequencies at significantly high frequencies (e.g., 0.1-10 GHz). The major element coupled to the minor elements then begins to vibrate at a frequency similar to the resonant frequency of the minor elements. Each minor element contributes vibrational energy to the major element which enables the major element to vibrate at a higher amplitude than possible with only a single nanoscale element. The vibration of the major element can produce an electrical signal, for example, in the gigahertz range (or higher) with sufficient strength to be detected, transmitted, and/or further processed enabling devices to be used in many desirable applications including wireless communications.

In general, the minor elements have at least one smaller dimension (e.g., length, thickness, width) than the major element. Minor elements can have a shorter length than the major element. The minor elements may have nanoscale (i.e., less than 1 micron) dimensions. In some embodiments, at least one of the dimensions is less than 1 micron; and, in some embodiments, the "large dimension" (i.e., the largest of the dimensions) is less than 1 micron. For example, minor elements may have a thickness and/or width of less than 1 micron (e.g., between 1 nm and 1 micron). Minor elements may have a large dimension (e.g., length) between about 0.1 micron and 10 micron; between 0.1 micron and 1 micron; or, between 1 micron to 100 micron. The major element can have a width and/or thickness of less than 10 micron (e.g., between 10 nm and 10 micron). The major element may have a length of greater than 1 micron (e.g., between 1 micron and 100 micron); in some cases, the major element 21 has a length of greater than 10 micron (e.g., between 10 micron and 500 micron). In some cases, the major element has a large dimension (e.g., length) of less than 500 micron. It should be understood that dimensions outside the above-noted ranges may also be suitable.

Figure 5:
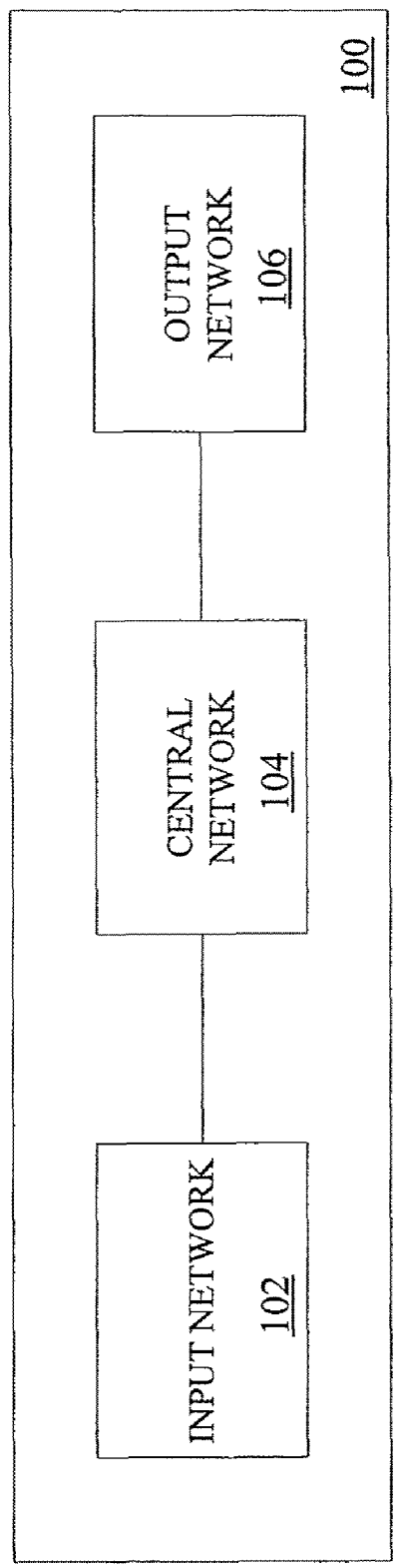
FIG. 5 shows a block diagram of a generic circuit according to an embodiment of the present invention.

In general, the devices may be used in any suitable circuit for any suitable application. For example, FIG. 5 illustrates an example of a typical signal processing circuit implemented on a chip having any suitable substrate. The circuit 100 can be divided into an input network 102, an output network 106, and a central network 104.

The central network can be a device as described herein. According to some embodiments, the device may be tuned by applying the necessary voltage to produce an output signal at a desired frequency or a filter at a particular band while also matching the impedance between the input network and the central network and the impedance between the central network and the output network. This is a critical advantage in most RF and signal processing circuits since circuit mismatches can result in deteriorated performance due to losses.

Typically impedances for the three networks are designed at 50Ω; however this impedance value may vary depending on the application. In certain cases, designers may retain mismatches to achieve a particular design objective.

Figure 6:
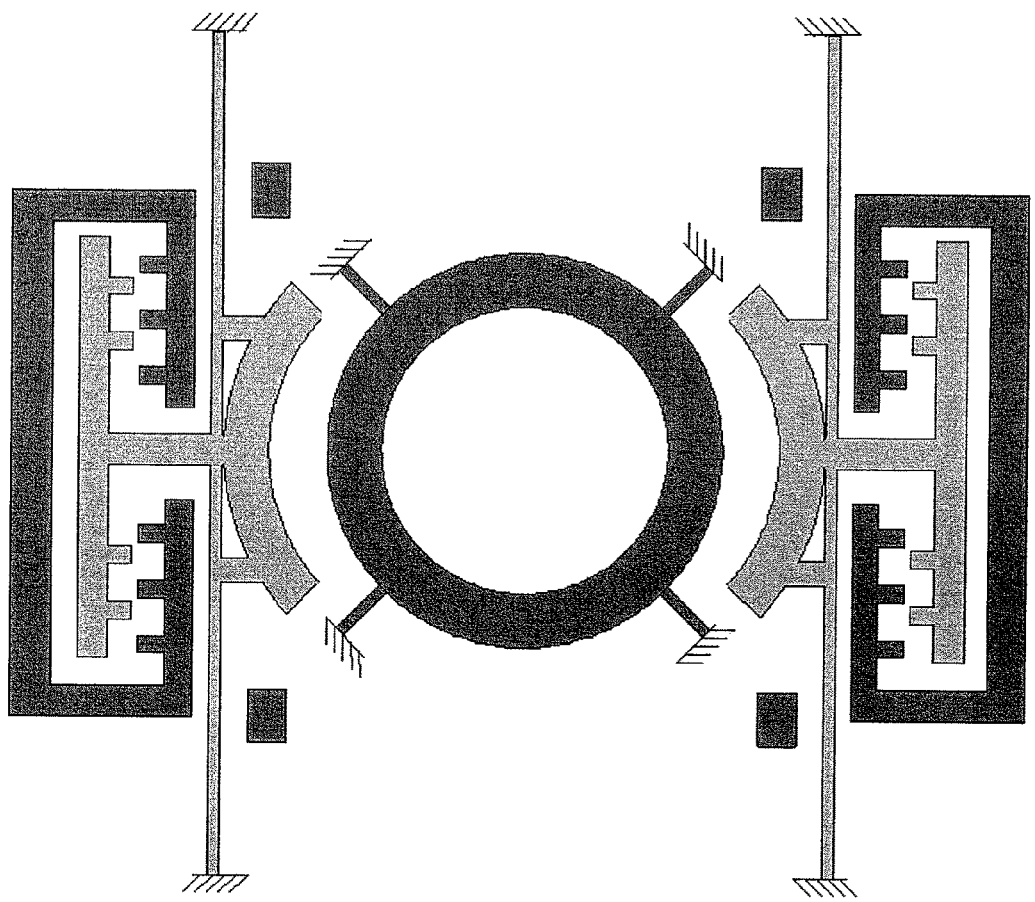
FIG. 6 shows a tunable micromechanical resonating device with a circular resonating structure according to an embodiment of the present invention.

It should also be understood that the devices may have several configurations and/or geometries. The geometry of the device can include, for example, any antenna type geometry, as well as beams, cantilevers, free-free bridges, free-clamped bridges, clamped-clamped bridges, discs, rings, prisms, cylinders, tubes, spheres, shells, springs, polygons, diaphragms and tori. FIG. 6, for example, illustrates, according to some embodiments, a resonating structure of the device having a circular geometry with the actuation and detection structures also having circular portions. Any of the mechanical resonating structure and/or coupling elements may be formed either in whole or in part of the same or different geometries. In addition, several different type geometrical structures may be coupled together to obtain particular resonance mode responses. It should be understood that not all embodiments include major and minor mechanical resonating elements. Structures of portions are not limited to beam structures and may be array structures, circular structures, and any other suitable structure.

According to some embodiments, the devices can be integrated in tunable meters, mass sensors, gyros, accelerometers, switches, and electromagnetic fuel sensors. According to some embodiments, the devices can be integrated in a timing oscillator. Timing oscillators can be used in several devices including digital clocks, radios, computers, oscilloscopes, signal generators, and cell phones. The devices can precisely generate clock signals, for example, as a reference frequency to help synchronize other signals that are received, processed, or transmitted by a device in which the timing oscillator is integrated in. Often times, multiple processes are run simultaneously on a device and the execution of such processes rely on a clock signal that can be generated by the devices.

Figure 7:
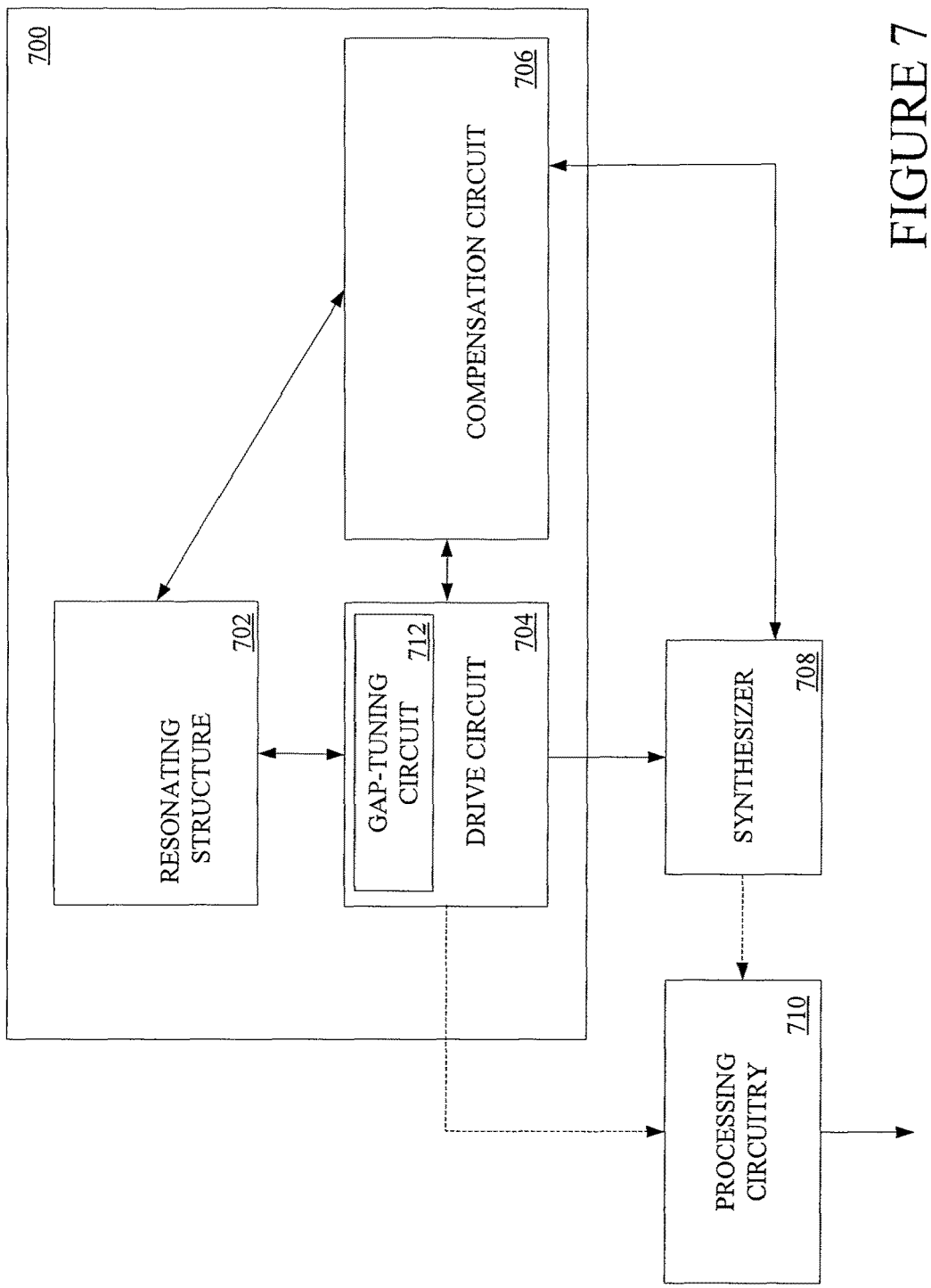
FIG. 7 shows a timing oscillator including a tunable micromechanical resonating device according to an embodiment of the present invention.

The timing oscillator can include a micromechanical resonating device 702, a drive circuit 704 coupled to the device, and a compensation circuit 706 adapted to adjust an output signal of the timing oscillator. Suitable timing oscillators have been described, for example, in U.S. patent application Ser. No. 12/111,544, filed Apr. 29, 2008 and published as U.S. Patent Publication No. 2009/0267699 A1, which is incorporated herein by reference in its entirety. A gap-tuning circuit 712 can be part of the drive circuit, as shown in FIG. 7, or the compensation circuit, or can be external to the drive circuit and to the compensation circuit but coupled to the resonating structure. The actuation structure can be coupled to the drive circuit and the detection structure can be coupled to the drive circuit and/or the compensation circuit. In some embodiments, the timing oscillator includes a synthesizer 708 coupled to the compensation circuit 706. The synthesizer can be external of the timing oscillator or integrated into the drive circuit. A Phase-Locked Loop (PLL) is an example of a synthesizer that can control the phase of a signal generated by the device. According to some embodiments, the synthesizer may comprise a filter, oscillator, or other signal processing devices well known to one of skill in the art. For example, the synthesizer can include a phase detector to minimize the difference between a signal generated by a drive circuit and a signal generated by a voltage-controlled oscillator (VCO). This process is repeated until the VCO's signal has a phase that matches the drive circuit's phase.

According to some embodiments, the output of the timing oscillator can be coupled to a processing circuit 710. The processing circuit can include any type of circuit or device to process the signal generated by the timing oscillator 700. For example, the processing circuit may include filters, mixers, dividers, amplifiers, or other application specific components and devices. A generated signal can be transmitted to other devices using a transmitter built into the processing circuitry. Configurations and connections between the processing circuitry, synthesizer, and the device may vary depending on the type of application and generated signal desired.

As discussed earlier, tunable devices offer several advantages when applied in various circuits and designs. For example, a micromechanical resonating device with a tunable capacitive gap can be used to tune the pass band of a filter, or to provide excellent control in matching the motional impedance of the resonating structure with the input and output networks of a device. In other cases, the motional impedance of a circuit can be tuned to obtain a desired mismatch within a device.

Having thus described several embodiments of this invention, it is to be appreciated that various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A micromechanical device comprising:
a mechanical resonating structure;
an actuation structure constructed and arranged to actuate the resonating structure; and
a detection structure constructed and arranged to detect motion of the resonating structure,
wherein an actuation gap is defined between a first portion of the resonating structure and a portion of the actuation structure, and a detection gap is defined between a second portion of the resonating structure and a portion of the detection structure,
wherein at least one of the actuation structure and the detection structure is constructed and arranged to move relative to the resonating structure to respectively tune the actuation gap and/or the detection gap.

2. The device of claim 1, wherein the actuation structure is constructed and arranged to move relative to the resonating structure to tune the actuation gap and the detection structure is constructed and arranged to move relative to the resonating structure to tune the detection gap.

3. The device of claim 1, further comprising at least one motion limiting element designed to limit the motion of the actuation structure and/or detection structure relative to the resonating structure.

4. The device of claim 1, wherein the actuation structure is moved by applying a bias to the actuation structure and/or the detection structure is moved by applying a bias to the detection structure.

5. The device of claim 4, wherein the actuation structure and/or detection structure includes a fixed portion and a suspended portion, and the applied bias moves the suspended portion relative to the fixed portion and relative to the resonating structure.

6. The device of claim 1, wherein the actuation and/or detection structure comprises a comb structure.

7. The device of claim 1, wherein the actuation gap is defined between a conductive portion of the actuation structure and a conductive portion of the resonating structure, and the detection gap is defined between a conductive portion of the detection structure and a conductive portion of the resonating structure.

8. The device of claim 7, wherein the conductive portion of the actuation structure is part of a suspended portion of the actuation structure.

9. The device of claim 7, wherein the conductive portion of the detection structure is part of a suspended portion of the detection structure.

10. The device of claim 7, wherein the conductive portion of the resonating structure is the first portion of the resonating structure.

11. The device of claim 7, wherein the conductive portion of the resonating structure is the second portion of the resonating structure.

12. The device of claim 1, wherein the actuation structure actuates the resonating structure when the capacitance between the actuation structure and the resonating structure is changed.

13. The device of claim 1, wherein the detection structure detects motion of the resonating structure when the capacitance between the detection structure and the resonating structure is changed.

14. The device of claim 1, wherein the resonating structure resonates primarily in a plane substantially perpendicular to the actuation gap and/or detection gap.

15. The device of claim 1, wherein the actuation gap and/or detection gap is substantially constant when the resonating structure resonates.

16. The device of claim 1, wherein the resonating structure comprises major elements and minor elements.

17. The device of claim 16, wherein the major elements have a large dimension between 1 micron and 100 micron and the minor elements have a large dimension between 0.1 micron and 10 micron.

18. The device of claim 1, wherein the detection structure is the same structure as the actuation structure.

19. A micromechanical device comprising:
a mechanical resonating structure including a suspended resonating portion defined between a first end and a second end;
an actuation structure constructed and arranged to actuate the resonating structure, the actuation structure including a suspended actuation portion defined between a third end and a fourth end; and
a detection structure constructed and arranged to detect motion of the resonating structure, the detection structure including a suspended detection portion defined between a fifth and a sixth end.

20. The device of claim 19, wherein an actuation gap is defined between the suspending resonating portion and the suspended actuation portion, and a detection gap is defined between the suspended resonating portion and the suspended detection portion.

21. The device of claim 20, wherein the actuation structure and the detection structure are constructed and arranged to move relative to the resonating structure to respectively tune the actuation gap and/or detection gap.

22. The device of claim 19, wherein the actuation structure actuates the resonating structure when the capacitance between the actuation structure and the resonating structure is changed and the detection structure detects motion of the resonating structure when the capacitance between the detection structure and the resonating structure is changed.

23. A micromechanical device comprising:
a capacitive structure comprising a suspended first portion and a suspended second portion separated from the first portion by a distance, wherein at least one of the first portion and the second portion is designed to actuate in response to an applied bias to change the distance; and
a mechanical resonating structure located, at least in part, between the first portion and the second portion.

24. A timing oscillator comprising:
a mechanical resonating structure including a major element and a minor element coupled to the major element;
a drive circuit designed to provide an input signal to the mechanical resonating structure;
a compensation circuit coupled to the mechanical resonating structure;
an actuation structure constructed and arranged to actuate the mechanical resonating structure; and
a detection structure constructed and arranged to detect motion of the mechanical resonating structure,
wherein an actuation gap is defined between a portion of the mechanical resonating structure and a portion of the actuation structure, and a detection gap is defined between a portion of the mechanical resonating structure and a portion of the detection structure,
wherein at least one of the actuation structure and the detection structure is constructed and arranged to move relative to the mechanical resonating structure to respectively tune the actuation gap and/or the detection gap.

25. The timing oscillator of claim 24, wherein the drive circuit comprises a gap-tuning circuit to tune the actuation gap and/or the detection gap.

26. The timing oscillator of claim 24, wherein the detection structure is coupled to the compensation circuit to provide feedback to the compensation circuit.

27. The timing oscillator of claim 24, wherein the detection structure is coupled to the drive circuit to provide feedback to the drive circuit.

28. The timing oscillator of claim 27, wherein the detection structure provides the feedback to modify a frequency of the resonating structure.

29. A method of operating a micromechanical device comprising:
providing a micromechanical device including:
a mechanical resonating structure;
an actuation structure constructed and arranged to actuate the resonating structure; and
a detection structure constructed and arranged to detect motion of the resonating structure,
wherein an actuation gap is defined between a portion of the resonating structure and a portion of the actuation structure, and a detection gap is defined between a portion of the resonating structure and a portion of the detection structure;
moving the actuation structure and/or the detection structure relative to the resonating structure to respectively tune the actuation gap and/or detection gap; and
actuating the resonating structure.

30. The method of claim 29, comprising applying a bias to move the actuation structure relative to the resonating structure to tune the actuation gap.

31. The method of claim 29, comprising applying a bias to move the detection structure relative to the resonating structure to tune the detection gap.

32. The method of claim 29, wherein the resonating structure is actuated when the capacitance between the actuation structure and the resonating structure is changed.

* * * * *